(12) United States Patent
Xu

(10) Patent No.: US 6,437,383 B1
(45) Date of Patent: Aug. 20, 2002

(54) DUAL TRENCH ISOLATION FOR A PHASE-CHANGE MEMORY CELL AND METHOD OF MAKING SAME

(75) Inventor: Daniel Xu, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/745,322

(22) Filed: Dec. 21, 2000

(51) Int. Cl.[7] .............................................. H01L 29/72
(52) U.S. Cl. ..................... 257/300; 257/2; 257/110; 257/121; 257/124; 257/192; 257/246; 257/295; 257/296; 257/300; 257/350
(58) Field of Search ................................ 257/295, 296, 257/300, 2, 110, 121, 124, 192, 246, 350

(56) References Cited

U.S. PATENT DOCUMENTS 6,087,674 A * 7/2000 Ovshinsky et al. ............ 257/2
6,165,836 A * 12/2000 Forbes et al. ................ 257/300

\* cited by examiner

Primary Examiner—Edward Wojciechowicz
(74) Attorney, Agent, or Firm—Anthony M. Martinez

(57) ABSTRACT

The invention relates to a phase-change memory device. The device includes a double-trench isolation structure around the diode stack that communicates to the lower electrode. The present invention also relates to a method of making a phase-change memory device. The method includes forming two orthogonal and intersecting isolation trenches around a memory cell structure diode stack.

15 Claims, 18 Drawing Sheets

DUAL TRENCH ISOLATION FOR A PHASE-CHANGE MEMORY CELL AND METHOD OF MAKING SAME

BACKGROUND OF THE INVENTION

1. Field of the Invention

The present invention relates to a phase-change memory device. More particularly, the present invention relates isolation of the memory device. In particular, the present invention relates to a phase-change memory device with minimum feature size.

2. Description of Related Art

As microelectronic technology progresses, the need has arisen for new data retention schemes. One such data retention scheme is the chalcogenide phase-change technology. Typically, a phase-change memory device includes a lower electrode, also known as a "matchstick". The lower electrode may be polysilicon, metal, or a metal compound such as a metal nitride.

One challenge of forming a lower electrode in a phase-change memory cell is to shrink the cell size while not losing increasing cross-talking between a given memory cell and a neighboring memory cell.

After the formation of a recess in a substrate that exposes an active area, a conformal introduction of lower electrode material is required. Lower electrode material is typically any electrically conductive or semiconductive material such as polycrystalline silicon, metal, or metal compound. The conformal introduction of lower electrode material that is polycrystalline silicon may follow conventional introduction techniques known to those skilled in the art including chemical vapor deposition (CVD) techniques. Thereafter, a dopant is introduced into the polycrystalline silicon to adjust the resistivity, in one aspect, to lower the resistivity of the material. A suitable dopant is a P-typed dopant such as boron introduced. From the combination of polysilicon and dopant, a silicidation process is required to form a silicide of the lower electrode. This process typically is a doping, a first anneal, a wet strip, and a second anneal.

After proper doping and fill into the trench, a planarization step is required to remove any horizontal component of the lower electrode. Thereafter, a modifier material must be introduced into a portion of the lower electrode material to combine and/or react with the lower electrode material near the top to form a different material. The formation of a different material also prepares the top of the matchstick to form suitable ohmic contact with the phase-change material. The modifier is introduced to raise the local resistance of the lower electrode material. By modifying a portion of the lower electrode material, the resistivity at that modified portion may be changed. Because the modifying material is of a higher resistivity, the lower electrode may not provide sufficiently suitable ohmic contact between the lower electrode and the volume of memory material for a desired application. In such cases, modifying material may be introduced into the lower electrode at a depth below the exposed surface of the lower electrode. For example, a lower electrode of polycrystalline silicon may have polycrystalline silicon at the exposed surface and a modifying material at a depth below the exposed surface. Additionally, barrier materials must be added to prevent cross-contamination between the chalcogenide material and the lower electrode.

BRIEF DESCRIPTION OF THE DRAWINGS

In order that the manner in which the above recited and other advantages of the invention are obtained, a more particular description of the invention briefly described above will be rendered by reference to specific embodiments thereof which are illustrated in the appended drawings. Understanding that these drawings depict only typical embodiments of the invention that are not necessarily drawn to scale and are not therefore to be considered to be limiting of its scope, the invention will be described and explained with additional specificity and detail through the use of the accompanying drawings in which.

DETAILED DESCRIPTION OF THE INVENTION

The invention relates to a memory device that is used with phase-change material to memorialize data storage. The device uses a lower electrode material that is referred to as a "matchstick". Beneath the matchstick, a diode stack is provided to activate the lower electrode. A first isolation trench is formed, followed by a second isolation trench. The second isolation trench is orthogonal to the first isolation trench. The lower electrode is formed over the diode stack portion of the memory cell structure, and a volume of phase change memory material is disposed above the matchstick. Either a high resistivity metal compound may be used as the lower electrode, or a polysilicon compound may be used.

The following description includes terms, such as upper, lower, first, second, etc. that are used for descriptive purposes only and are not to be construed as limiting. The embodiments of an apparatus or article of the present invention described herein can be manufactured, used, or shipped in a number of positions and orientation. Reference will now be made to the drawings wherein like structures will be provided with like reference designations. In order to show the structures of the present invention most clearly, the drawings included herein are diagrammatic representations of integrated circuit structures. Thus, the actual appearance of the fabricated structures, for example in a photomicrograph, may appear different while still incorporating the essential structures of the present invention. Moreover, the drawings show only the structures necessary to understand the present invention. Additional structures known in the art have not been included to maintain the clarity of the drawings.

Figure 1:
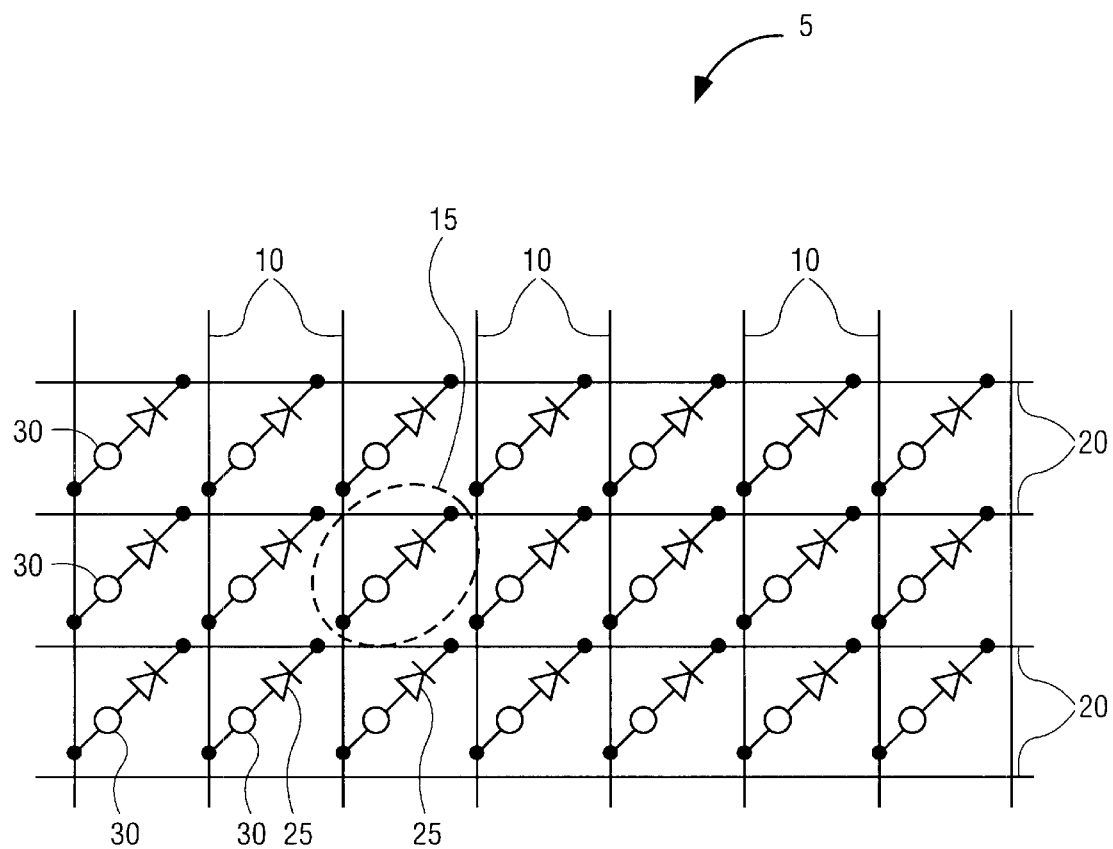
FIG. 1 is a schematic diagram of an array of memory elements according to an embodiment of the invention.

FIG. 1 shows a schematic diagram of an embodiment of a memory array comprised of a plurality of memory elements presented and formed in the context of the invention. In this example, the circuit of memory array 5 includes an array with memory element 30 electrically interconnected in series with isolation device 25 on a portion of a chip. Address lines 10 (e.g., columns) and 20 (e.g., rows) are connected, in one embodiment, to external addressing circuitry in a manner known to those skilled in the art. One purpose of the array of memory elements in combination with isolation devices is to enable each discrete memory element to be read and written without interfering with the information stored in adjacent or remote memory elements of the array.

A memory array such as memory array 5 may be formed in a portion, including the entire portion, of a substrate. A typical substrate includes a semiconductor substrate such as a silicon substrate. Other substrates including, but not limited to, substrates that contain ceramic material, organic material, or glass material as part of the infrastructure are also suitable. In the case of a silicon semiconductor substrate, memory array 5 may be fabricated over an area of the substrate at the wafer level and then the wafer may be reduced through singulation into discrete die or chips, some or all of the die or chips having a memory array formed thereon. Additional addressing circuitry such as sense amplifiers, decoders, etc. may be formed in a similar fashion as known to those of skill in the art.

Figure 2:
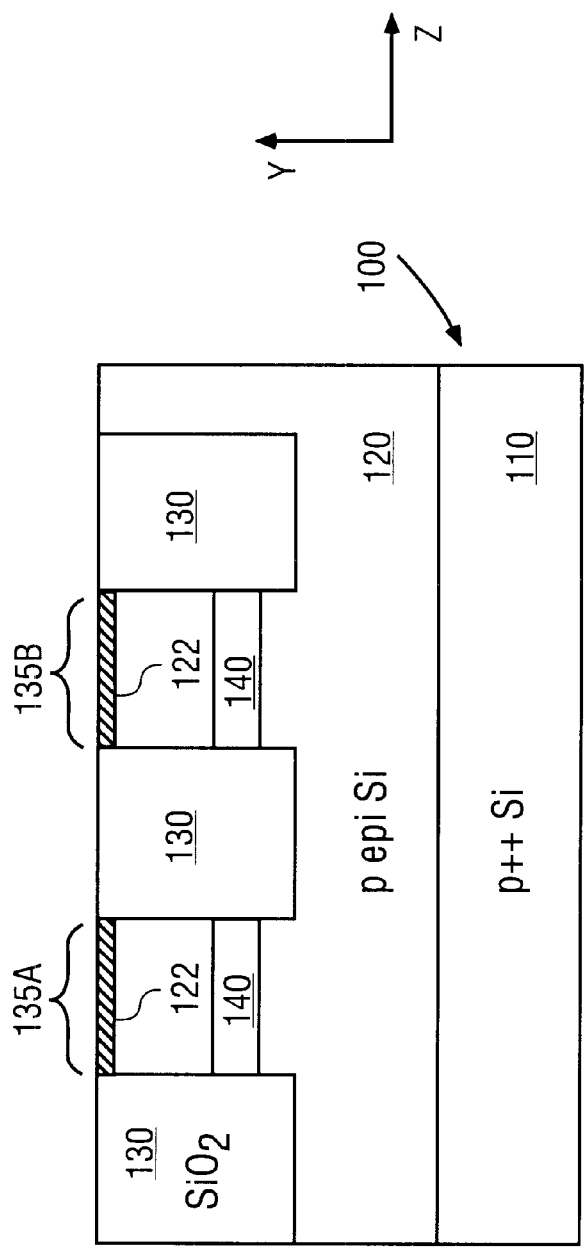
FIG. 2 schematically illustrates a cross-sectional planar side view of a portion of a semiconductor substrate having a first shallow trench isolation (STI) structure formed in trenches that define a z-direction thickness of a memory cell in accordance with one embodiment of the invention.

FIGS. 2–18 illustrate the fabrication of representative memory element 15 of FIG. 1 according to various embodiments. FIG. 2 shows a portion of substrate 100 that is, for example, a semiconductor substrate. In one embodiment, a P-type dopant such as boron is introduced in a deep portion 110. In one example, a suitable concentration of P-type dopant is on the order of above $5 \times 10^{19} - 1 \times 10^{20}$ atoms per cubic centimeters (atoms/cm$^3$) rendering deep portion 110 of substrate 100 representatively P$^{++}$. Overlying deep portion 110 of substrate 100, in this example, is an epitaxial portion 120 of P-type epitaxial silicon. In one example, the dopant concentration in epitaxial portion 120 is on the order of about $10^{16} - 10^{17}$ atoms/cm$^3$. The introduction and formation of epitaxial portion 120 as P-type, and deep portion 110 as a P++ type portion may follow techniques known to those of skill in the art. FIG. 2 also illustrates the formation of a signal line material 140 by ion implantation to a preferred depth. Other embodiments that do not use structures such as the P++ portion and the P epitaxial portion may be used as are known in the art. One example is a non-epitaxial wafer.

Figure 3:
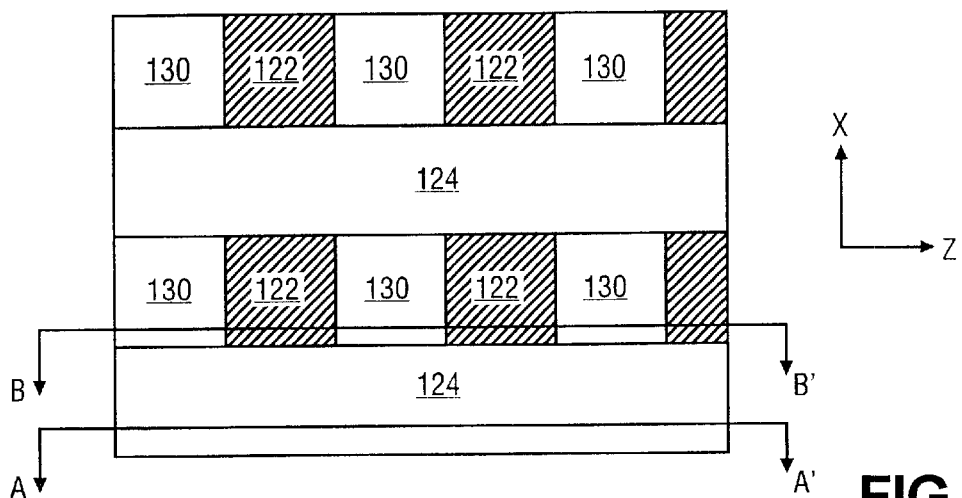
FIG. 3 is a top plan view of one embodiment of the present invention.

FIG. 2 also shows first shallow trench isolation (STI) structures 130 formed in epitaxial portion 120 of substrate 100. First STI structures 130 may be formed with the assistance of a hard mask 122 such as a silicon nitride material. FIG. 3 is a top plan view of substrate 100 after patterning of a second mask 124 over both first STI structures 130 and hard mask 122.

Second mask 124 is first blanket deposited and then patterned. Second mask 124 is employed during a second etch that is orthogonal to first STI structures 130. In a two-process etch, second mask 124 is patterned orthogonal to first STI structures 130 with what may be one feature-width (1F-width) strips.

Figure 4A:
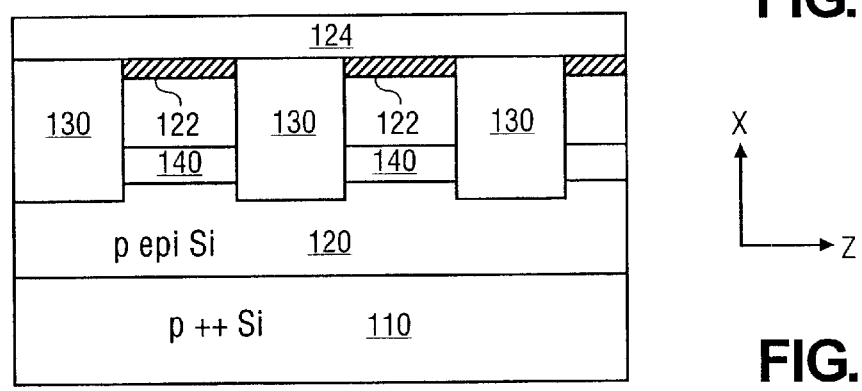
FIG. 4a is an elevational cross-section view of the structure depicted in FIG. 3.
Figure 4B:
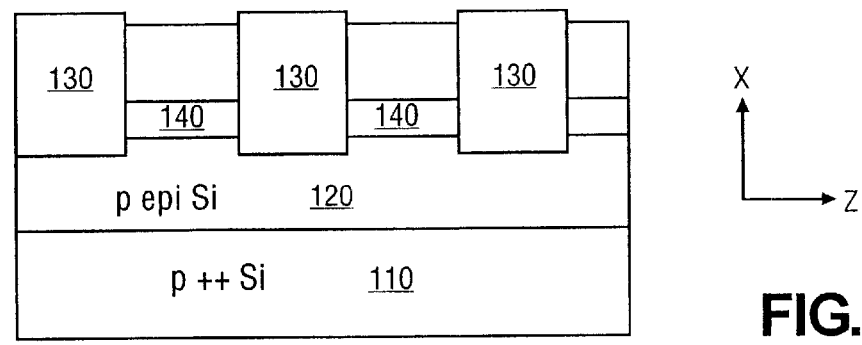
FIG. 4b is an elevational cross-section view of the structure depicted in FIG. 4a after further processing.

FIG. 4a is an elevational cross-section view of the structure depicted in FIG. 3, taken through the section line A–A'. Second mask 124 is depicted as protecting a region that will become a plurality of isolated diode stacks. FIG. 4b is an elevational cross-section view of the structure depicted in FIG. 3, taken along the line B–B' during an etch to remove hard mask 122. Where hard mask 122 is a nitride such as silicon nitride, the etch may remove a portion of first STI structures 130 which is typically an oxide. Such etch conditions are known in the art.

Figure 4C:
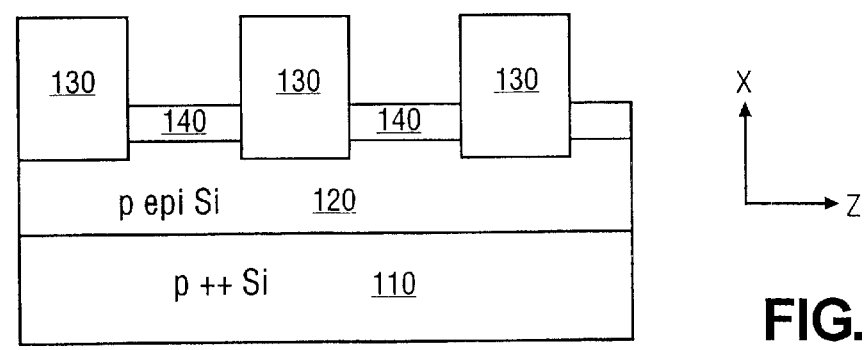
FIG. 4c is an elevational cross-section view of the structure depicted in FIG. 4b after further processing.

FIG. 4c is an elevation cross-section view of the structure depicted in FIG. 4b after further processing. Following the removal etch of hard mask 122, a silicon etch is carried out with the same patterning of second mask 124. The etch recipe is selective to leave the oxide of first STI structures 130. Following the patterning and silicon etching, N-type dopant may be introduced at the base of each recess to form pockets 200 having a dopant concentration on the order of about $10^{18} - 10^{22}$ atoms/cm$^3$.

Figure 5:
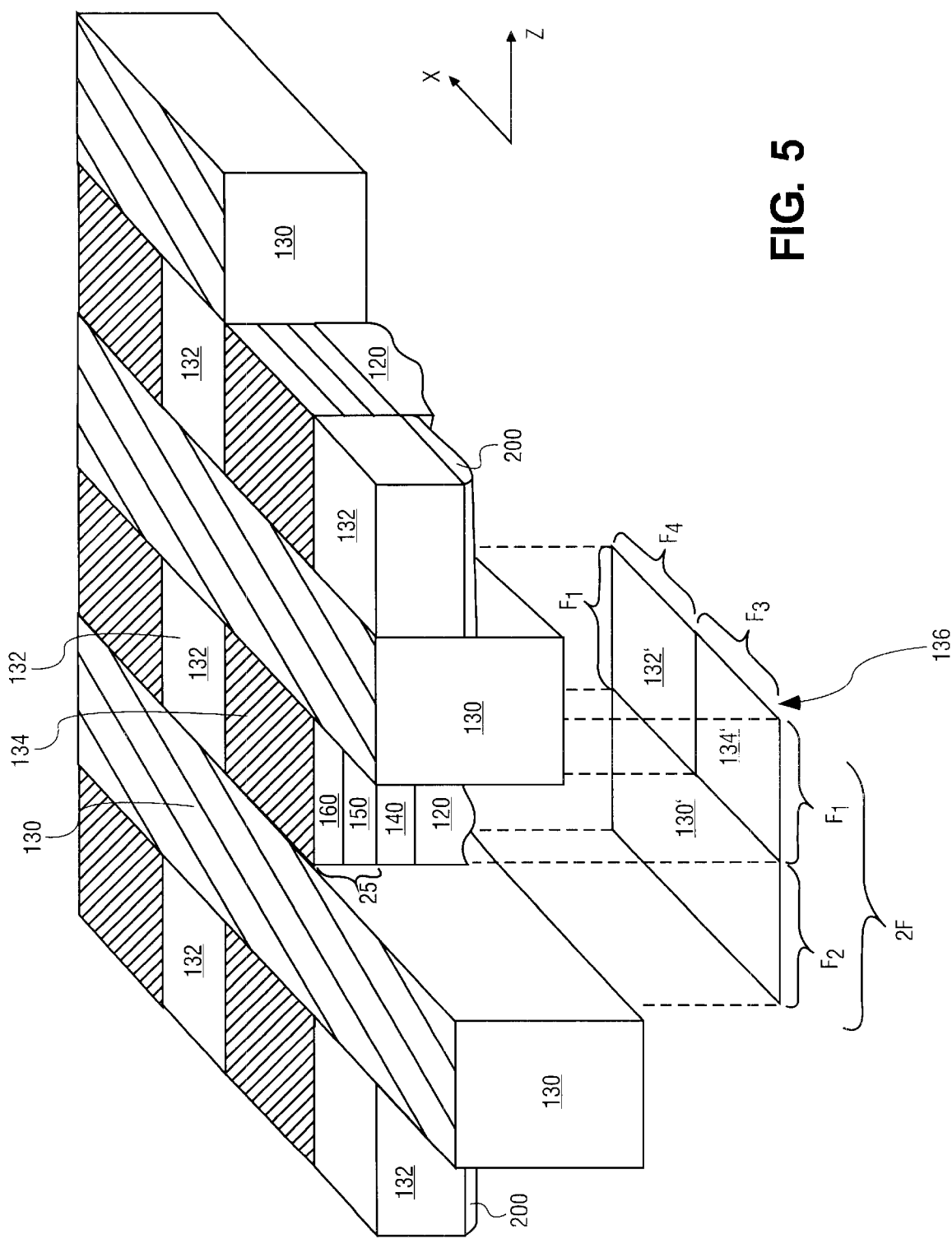
FIG. 5 is an elevational oblique view of the structure depicted in FIG. 4c after further processing that illustrates selected structures.

After the silicon etch, oxide is filled into the recesses to form second shallow trench (SST) structures 132 as depicted in FIG. 5 although in this embodiment, the structures are substantially filled quadrialateral recesses. FIG. 5 is an elevational oblique view of selected structures of the inventive memory device. In this embodiment, formation of first STI structure 130 has preceded the formation of SST structure 132. First STI structure 130 is substantially continuous at the upper surface. SST structure 132 is substantially discontinuous because of the silicon etch that left the oxide material of first STI structure 130. Thus, SST structure 132 comprises an intermittent upper surface shallow trench isolation structure disposed in the second trench, and first STI structure 130 comprises a continuous upper surface shallow trench isolation structure disposed in the first trench.

FIG. 5 also illustrates formation of an isolation device 25 that is a portion of a diode stack. Isolation device 25 includes a PN diode formed of N-type silicon portion 150 that may have a dopant concentration on the order of about $10^{17}$–$10^{22}$ atoms/cm$^3$ and P-type silicon portion 160 that may have a dopant concentration on the order of about $10^{19}$–$10^{21}$ atoms/cm$^3$. Although a PN diode is shown as isolation device 25, it is to be appreciated that other isolation structures are similarly suitable. Such isolation devices include, but are not limited to, MOS devices. A memory cell structure 134 is depicted that includes the epitaxial portion 120 of P-type epitaxial silicon, signal line material 140, the N Si portion 150 and the P+ Si portion 160.

A memory cell feature may be defined as a minimum geometry that defines the memory cell. For example, a first feature, $F_1$ may define an edge of memory cell structure 134. A second feature, $F_2$ may define a first edge geometry of first STI structure 130. A third feature $F_3$ may define a second edge geometry of memory cell structure 134. Finally, a fourth feature, $F_4$ may define an edge geometry of SST structure 132. Where the first and second features are substantially equal, they may be designated as 2F. In any event, the first through fourth features, when defined in a rectangular configuration are designated as four feature squared (4F$^2$) 136. Beneath the selected structures it can be seen that a projection of 4F$^2$ 136 illustrates the inventive unit cell of the memory isolation. In the present invention, a double trench isolation structure has been achieved that acts to isolate the diode stack of memory cell structure 134 in all directions by a distance of at least 1F. In this embodiment, a reducer material 170 (see FIG. 6) has not yet been formed, and planarization has created a surface that exposes first STI structure 130, SST structure 132, and P-type silicon portion 160.

Because the memory cell structure 134 is isolated by a double trench configuration, the likelihood of cross talk between adjacent memory cell structures is reduced. Additionally, trench depths may be on the order from about 3,000 Å to about 7,000 Å and SST structure 132 may have a total depth in a range a range from about 500 Å to about 3,500 Å. Trench depths are limited by etch time constraints. Additionally, the 4F$^2$ configuration is easily scalable and a simplifying portion to integrate with design rules as geometries continue to reduce, for example from 0.35 $\mu$M, 0.25 $\mu$M, 0.18 $\mu$M, 0.13 $\mu$M, 0.11 $\mu$M, etc. Additionally, the degree of the vertical beta in the diode stack is increased over the prior art.

Figure 6:
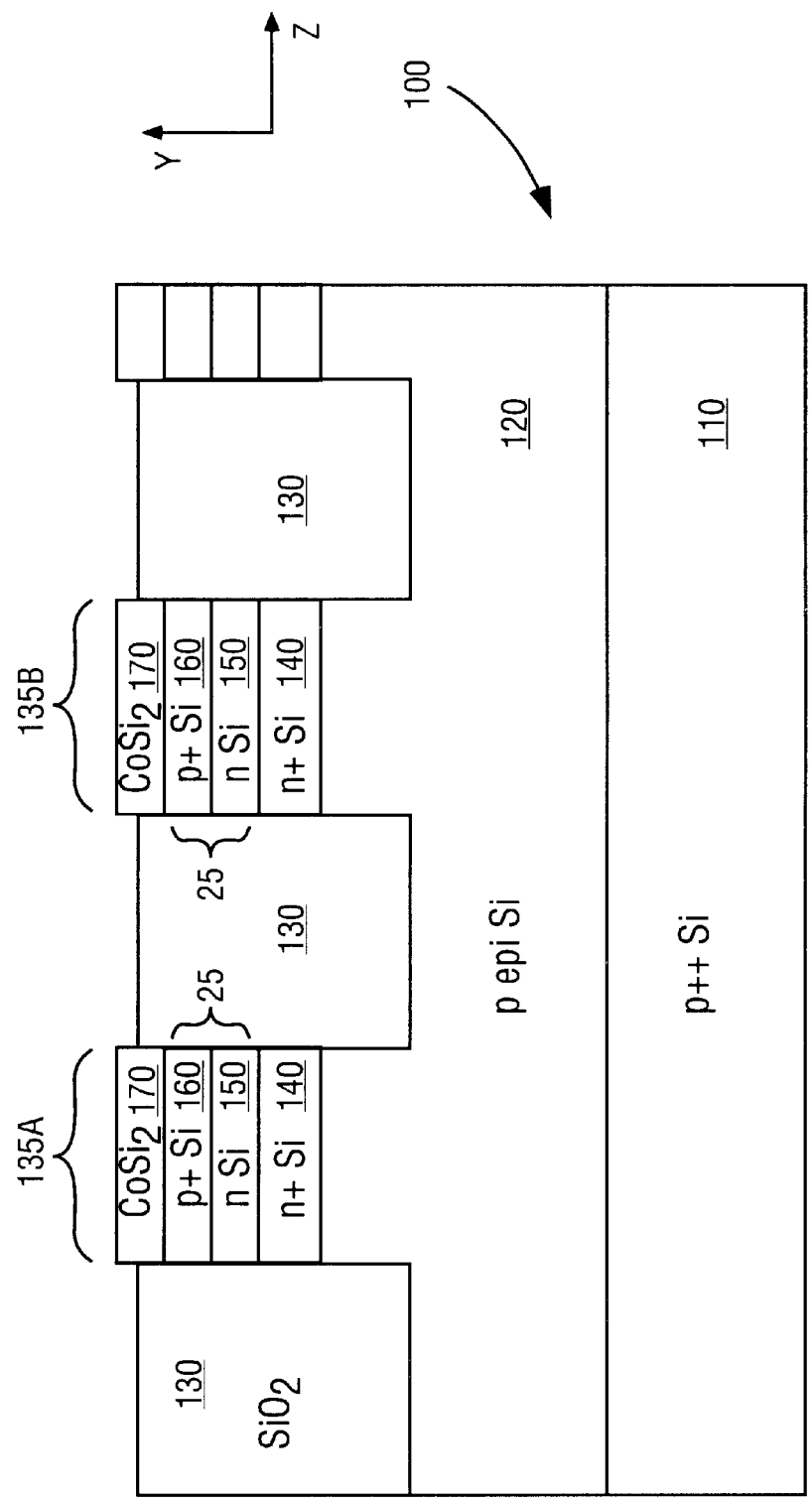
FIG. 6 shows the structure of FIG. 5 in cross cross-sectional view, after the introduction of dopants to form a diode stack portion of a memory cell structure in accordance with one embodiment of the invention.

FIG. 6 shows the structure of FIG. 4c after a further fabrication operation in memory cell regions 135A and 135B. Overlying epitaxial portion 120 of substrate 100 is first conductor or signal line material 140. In one example, first conductor or signal line material 140 is N-type doped polysilicon formed by the introduction of, for example, phosphorous or arsenic to a concentration on the order of about $10^{18}$–$10^{22}$ atoms/cm$^3$ such as N$^+$ silicon. In this example, first conductor or signal line material 140 serves as an address line, a row line such as row line 20 of FIG. 1. Overlying first conductor or signal line material 140 is an isolation device such as isolation device 25 of FIG. 1. In one example, isolation device 25 is a PN diode formed of N-type silicon portion 150 that may have a dopant concentration on the order of about $10^{17}$–$10^{22}$ atoms/cm$^3$ and P-type silicon portion 160 that may have a dopant concentration on the order of about $10^{19}$–$10^{21}$ atoms/cm$^3$. Although a PN diode 25 is shown, it is to be appreciated that other isolation structures are similarly suitable. Such isolation devices include, but are not limited to, MOS devices.

Referring again to FIG. 6, overlying isolation device 25 in memory cell regions 135A and 135B is a reducer material 170 of, in this example, a refractory metal silicide such as cobalt silicide (CoSi$_2$). Reducer material 170 may be formed at any one of several portions of the inventive process. When reducer material 170 is a metal silicide, it may be formed in place as a self-aligned silicide or salicide. Reducer material 170 may be formed at this portion of the process or it may be formed later. Reducer material 170, in one aspect, serves as a low resistance material in the fabrication of peripheral circuitry such as addressing circuitry of the circuit structure on the chip. Thus, reducer material 170 may not be required in terms of forming a memory element as described. Nevertheless, because of its low resistance property, its inclusion as part of the memory cell structure between isolation device 25 and memory element 30 is utilized in this embodiment.

Figure 7:
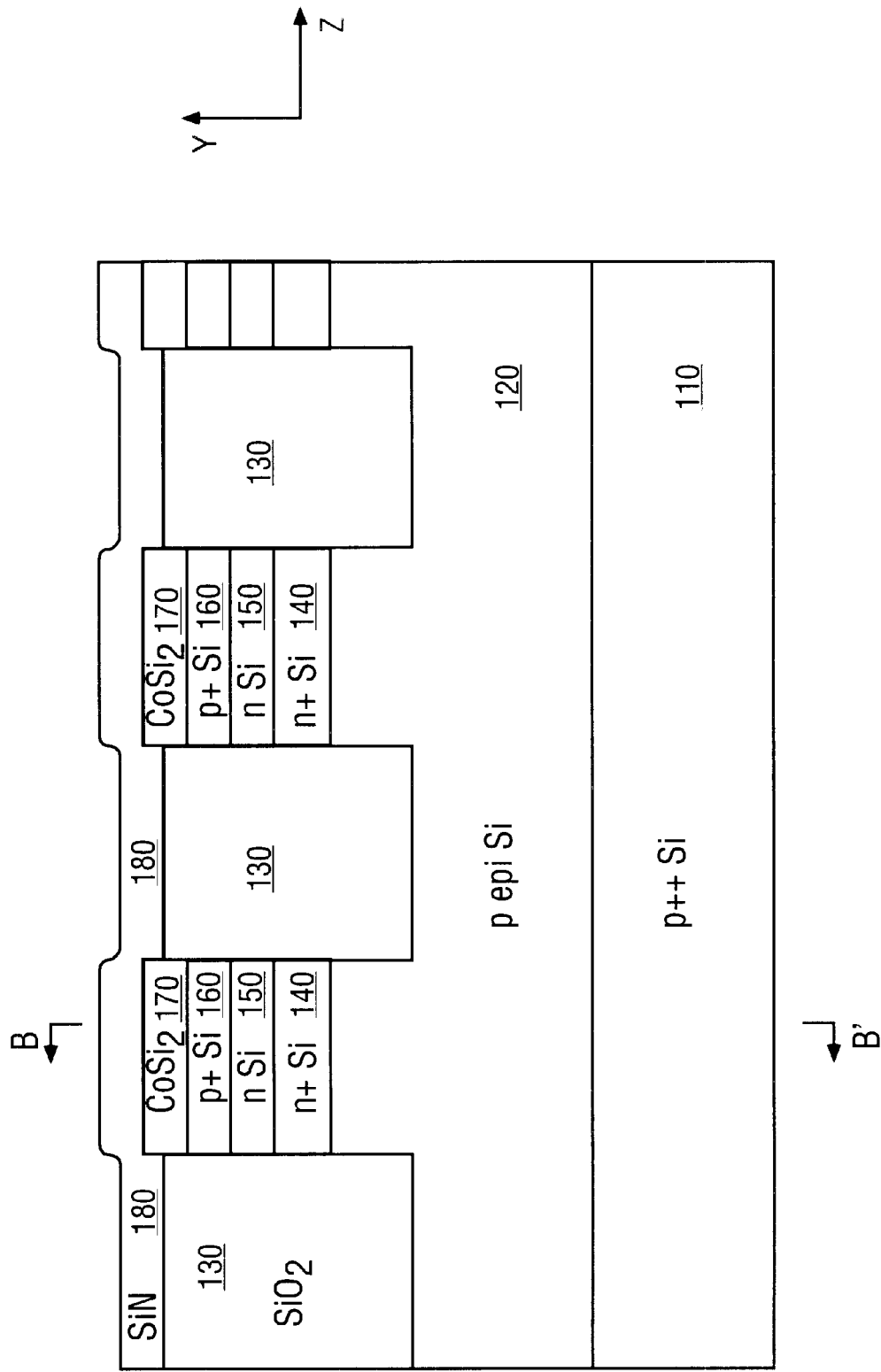
FIG. 7 shows the structure of FIG. 6 after the introduction of a masking material over the memory cell structure in accordance with one embodiment of the invention.

FIG. 7 shows the structure of FIG. 6 after the introduction of a masking material 180. In one embodiment, a suitable material for masking material 180 is a dielectric material such as silicon nitride (Si$_3$N$_4$) in both stoichiometric and other solid solution ratios, although other material may be used such as silicon oxide (Si$_x$O$_2$) or silicon oxynitride (Si$_x$O$_z$N$_y$) in both stoichiometric and other solid solution ratios.

Masking material 180 may serve as patterning to protect memory cell regions 135A as well as to protect portions of first STI structures 130 for a subsequent etch operation. In this embodiment, masking material 180 may be unpatterned and may act as a two-etch process etch stop. For example, where a contact corridor is formed, a two-etch process allows for a faster oxide etch that stops on masking layer 180, followed by a slower nitride etch that will stop on silicon such as an unlanded contact.

Figure 8:
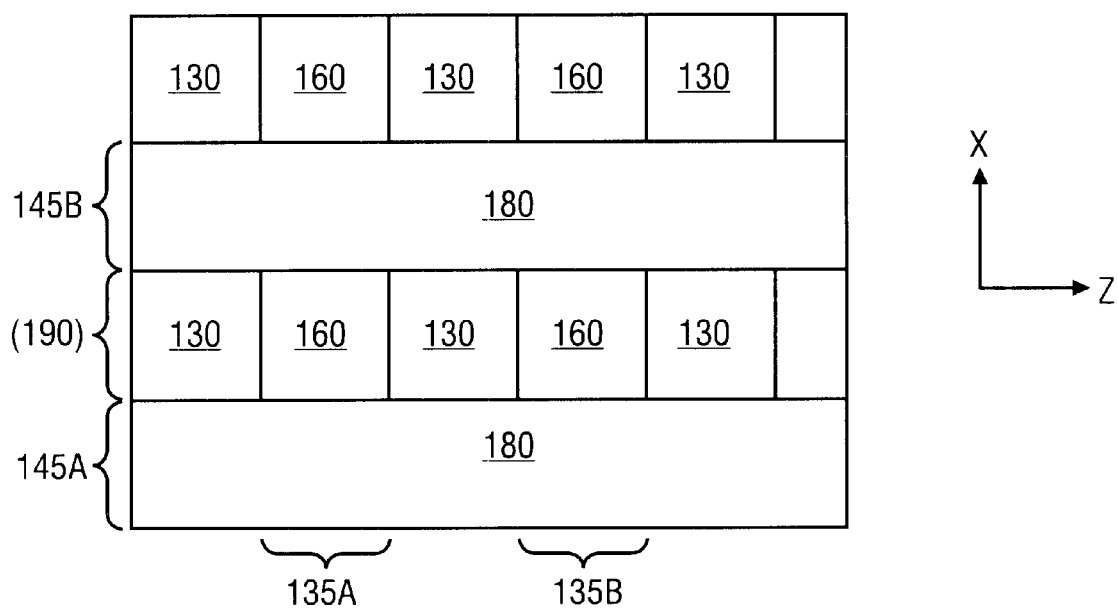
FIG. 8 shows a schematic top view of the structure of FIG. 2 according to another embodiment of the present invention in which the second trench etch removes a significant portion of the first shallow trench isolation structure.

In another embodiment, the formation of isolation device 25 may be carried out prior to the formation of SST structures 132. In this embodiment, masking material 180 comprises a patterned mask similar to second mask 124. FIG. 8 is a top plan view xz perspective of substrate 100 that illustrates this embodiment. Preferably for this embodiment, planarization is carried out to the extent that hard mask 122 has been entirely removed. Accordingly, the etch process flow may be simplified because no nitride etch is required. The formation of isolation device 25 is completed such that P-type silicon portion 160 is exposed in FIG. 8. Preferably, etching is carried out with an etch recipe that has a selectivity that does not substantially favor the material of STI structures 130 over the silicon of P-type silicon portion 160 or conductive material 150. Such etch recipes are known in the art and can be selected based upon the doping that has formed isolation device 25. From the patterning of hard mask 180, a trench (190, to be formed) will accommodate SST structures (also to be formed).

Figure 9:
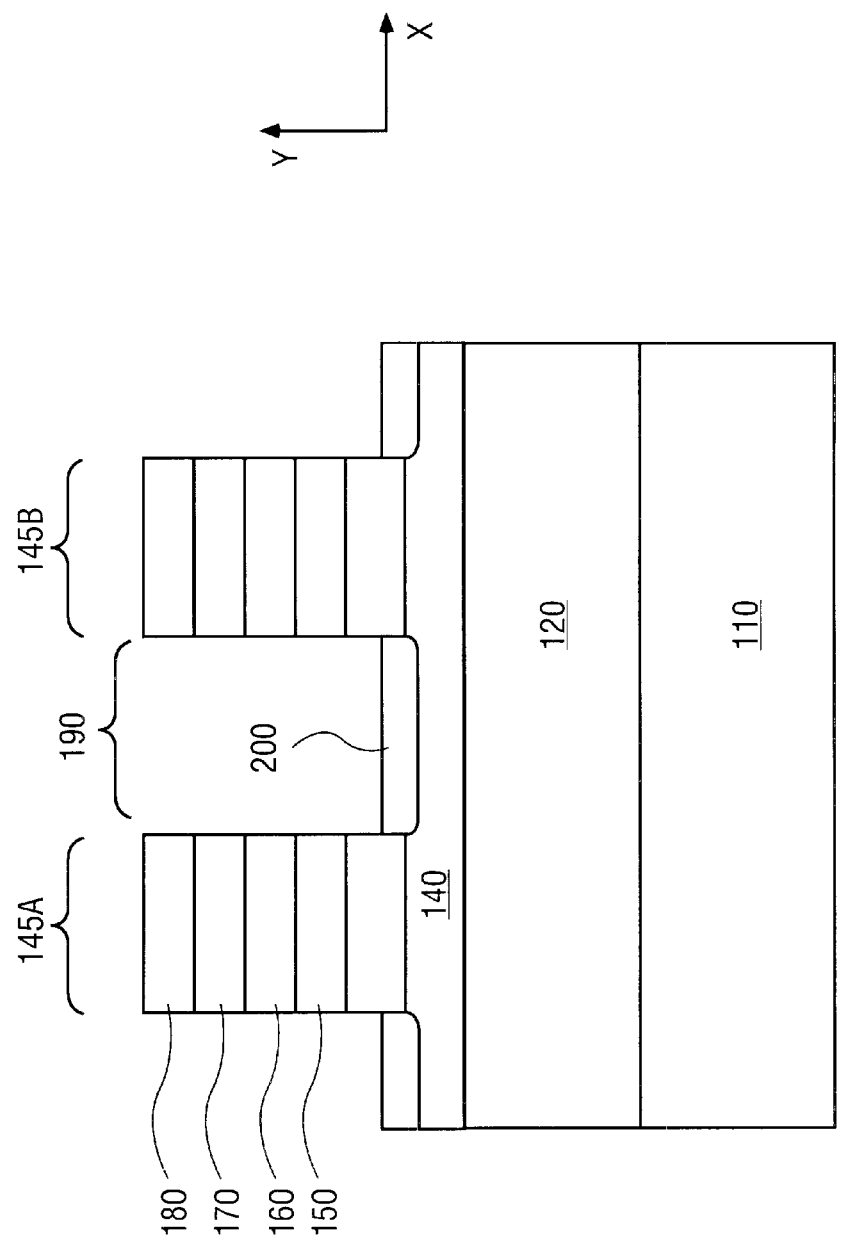
FIG. 9 shows the structure of FIG. 8, in cross-sectional view, after the patterning of the x-direction thickness of the semiconductor substrate structure, the formation of a second STI trench that is orthogonal to the first STI structure.

FIG. 9 shows the structure of FIG. 8 from an xy perspective after patterning of the x-direction thickness of the memory cell material to form a trench 190. FIG. 9 shows two memory cells 145A and 145B patterned from memory cell region 135A depicted in FIG. 2. The patterning may be accomplished using conventional techniques for etching, in this example, refractory metal silicide and silicon material to the exclusion of masking material 180. The definition of the x-direction thickness involves, in one embodiment, an etch to conductive material 150 (N-type silicon in this embodiment) of the memory line stack to define memory cells 145A and 145B of memory cell region 135A. In the case of an etch, the etch proceeds through the memory line stack to, in this example, a portion of a conductor or signal line that is in this case conductive material 150. A timed etch may be utilized to stop an etch at this point.

Figure 10:
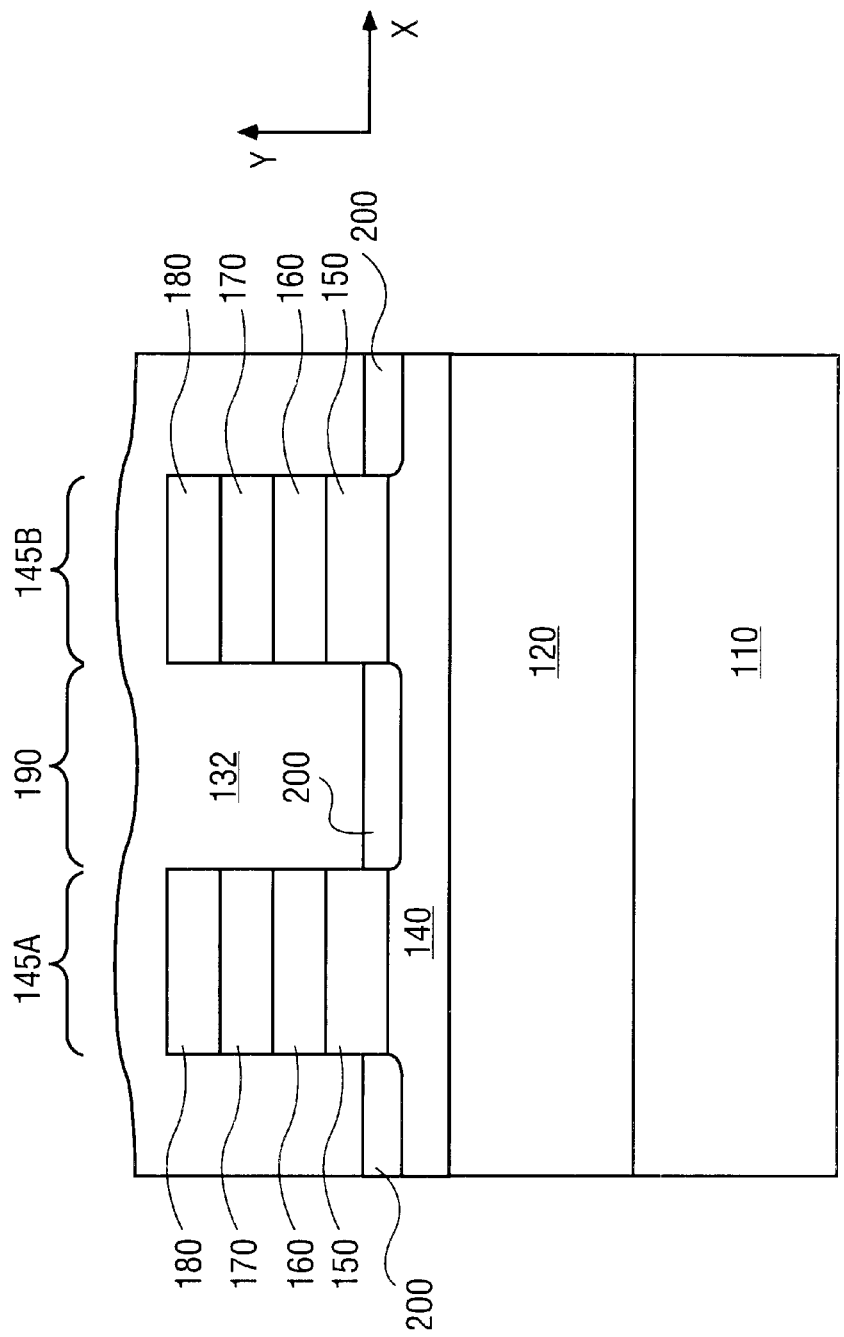
FIG. 10 shows the structure of FIG. 9, through the same cross-sectional view, after the filling of the second STI trench in accordance with one embodiment of the invention.

FIG. 10 shows the structure of FIG. 8 from an xy perspective after filling of trench 190. Following the patterning and etching of trench 190, N-type dopant may be introduced at the base of each trench 190 to form pockets 200 having a dopant concentration on the order of about $10^{18}$–$10^{22}$ atoms/m$^3$ to form an N$^+$ region between memory cells 145A and 145B. Pockets 200 serve, in one sense, to maintain continuity of a row line.

The SST structure 132 is formed over substrate 100 to substantially fill trench 190 as depicted in FIG. 10. Although reducer material 170 is depicted as being present in FIG. 10, it may be formed later, if at all, as will be set forth herein. SST structure 132 is formed in second isolation trench 190 in a direction that is orthogonal to first STI structure 130. SST structure 132 may be planarized to expose the diode stack. After planarization, both first STI structure 130 and SST structure 132 are exposed.

As an alternative to processing, prior to the formation of first STI structure 130 and/or SST structure 132, a thermal dielectric film may be formed in the respective trench(es). The thermal dielectric film(s) acts to assist with better formation of the trench(es).

Figure 11:
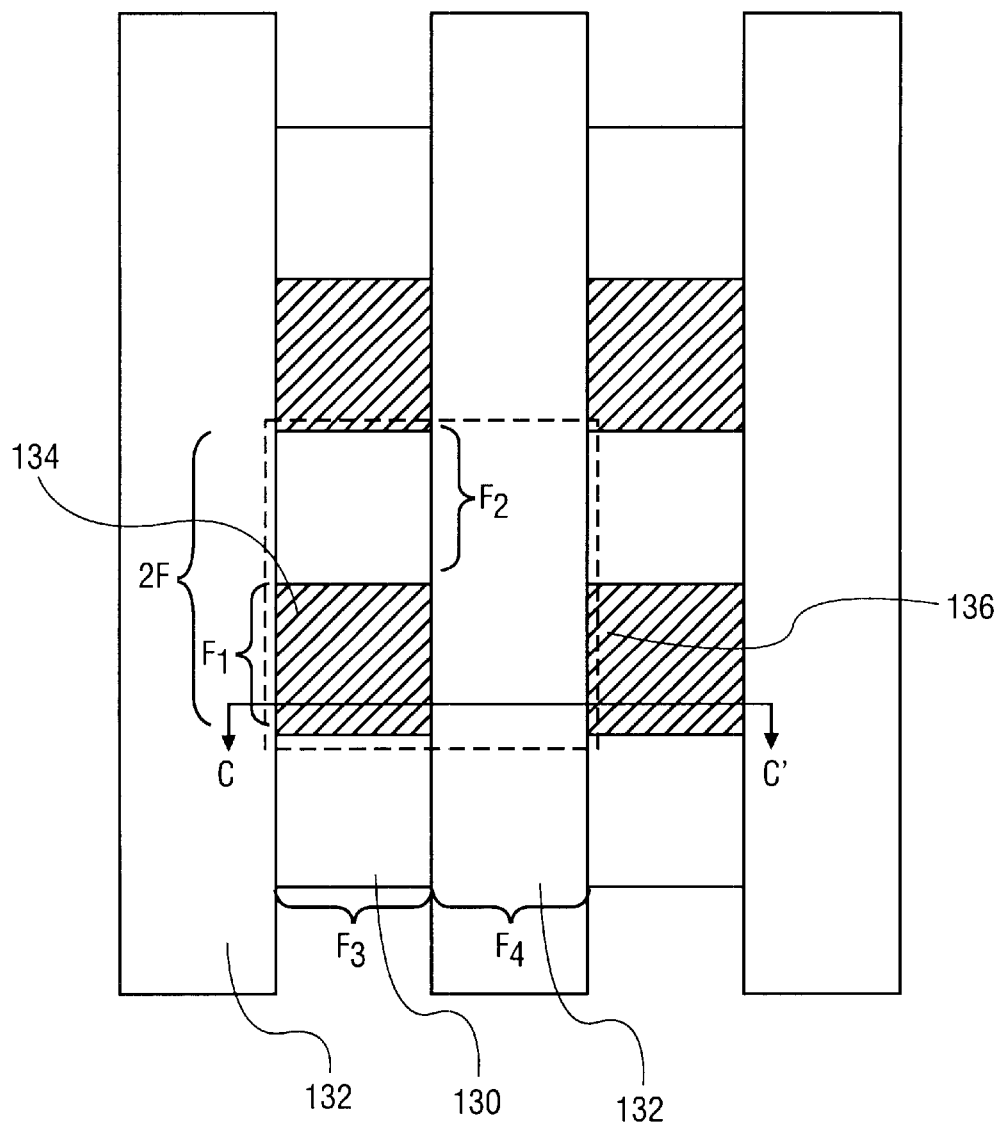
FIG. 11 is a top plan view of the structure depicted in FIG. 10 after planarization that illustrates the double trench aspect of the present invention.

FIG. 11 illustrates a top plan view of the structure achieved after planarization. First STI structure 130 is depicted as having been cut through by etching trench 190 (not pictured) and filling thereof to form SST structure 132. In other words, first STI structure 130 has a discontinuous upper surface and SST structure 132 has a substantially continuous upper surface. The line C–C' depicted in FIG. 11 delineates the cross-sectional view of the structure in FIG. 10.

A memory cell structure 134 is also depicted in FIG. 11. Memory cell structure 134 may have an exposed layer such as reducer material 170, or if it is not yet formed, P-type silicon portion 160 or the like. FIG. 11 illustrates substantial isolation of memory cell structure 134 wherein it is surrounded by two first STI structures 130 and two SST structures 132. The memory cell structure 134 is spaced apart from adjacent memory cell structures 134 by any of the four features. In other words, the spaced-apart isolation of memory cell structure 134 is a minimum as the smallest dimension of the 4F$^2$ configuration 136. FIG. 11 also illustrates one inventive structure of the present invention wherein an 4F$^2$ 136 configuration is present within the dashed line 136 to define a unit cell of the memory device.

Figure 12:
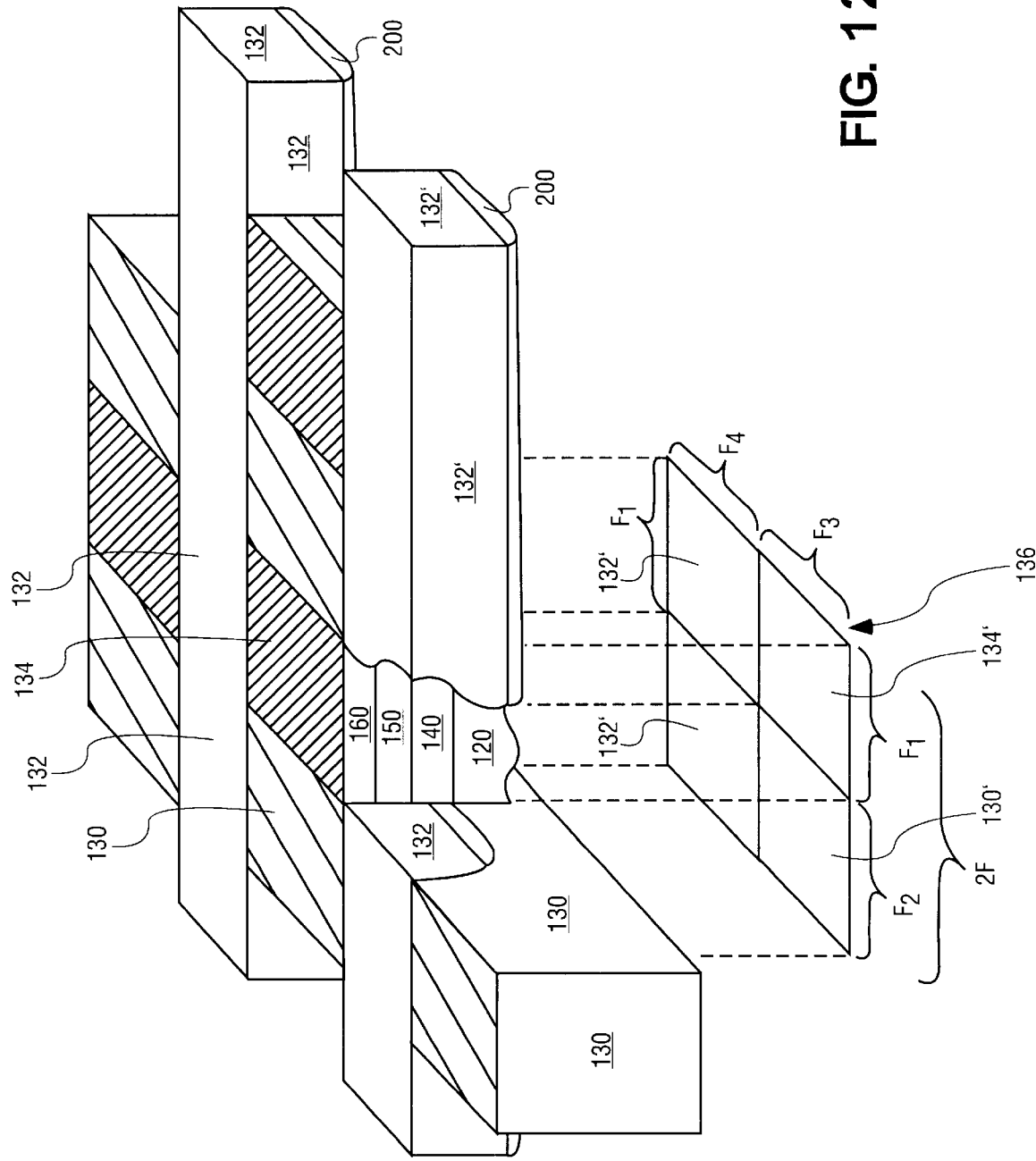
FIG. 12 is an elevational oblique view of selected structures of the inventive memory device after planarization.

FIG. 12 is an elevational oblique view of selected structures of the inventive memory device according to this embodiment. In this embodiment, formation of first STI structure 130 has preceded the formation of SST structure 132 and etching of trench 190 has accomplished a substantially similar etch rate for both the oxide of first STI structure 130 and of the silicon. Further, masking material 180 is not depicted in order to expose SST structure 132. Memory cell structure 134 is exposed by a cut-away of a SST structure 132'. Beneath the selected structures it can be seen that a projection of 4F$^2$ 136 illustrates the inventive unit cell of the memory isolation. In the present invention, a double trench isolation structure has been achieved that acts to isolate the diode stack of memory cell structure 134 in all directions by a distance of at least 1F. In this embodiment, reducer material 170 has not yet been formed, and planarization has created a surface that exposes first STI structure 130, SST structure 132, and P-type silicon portion 160.

Figure 13:
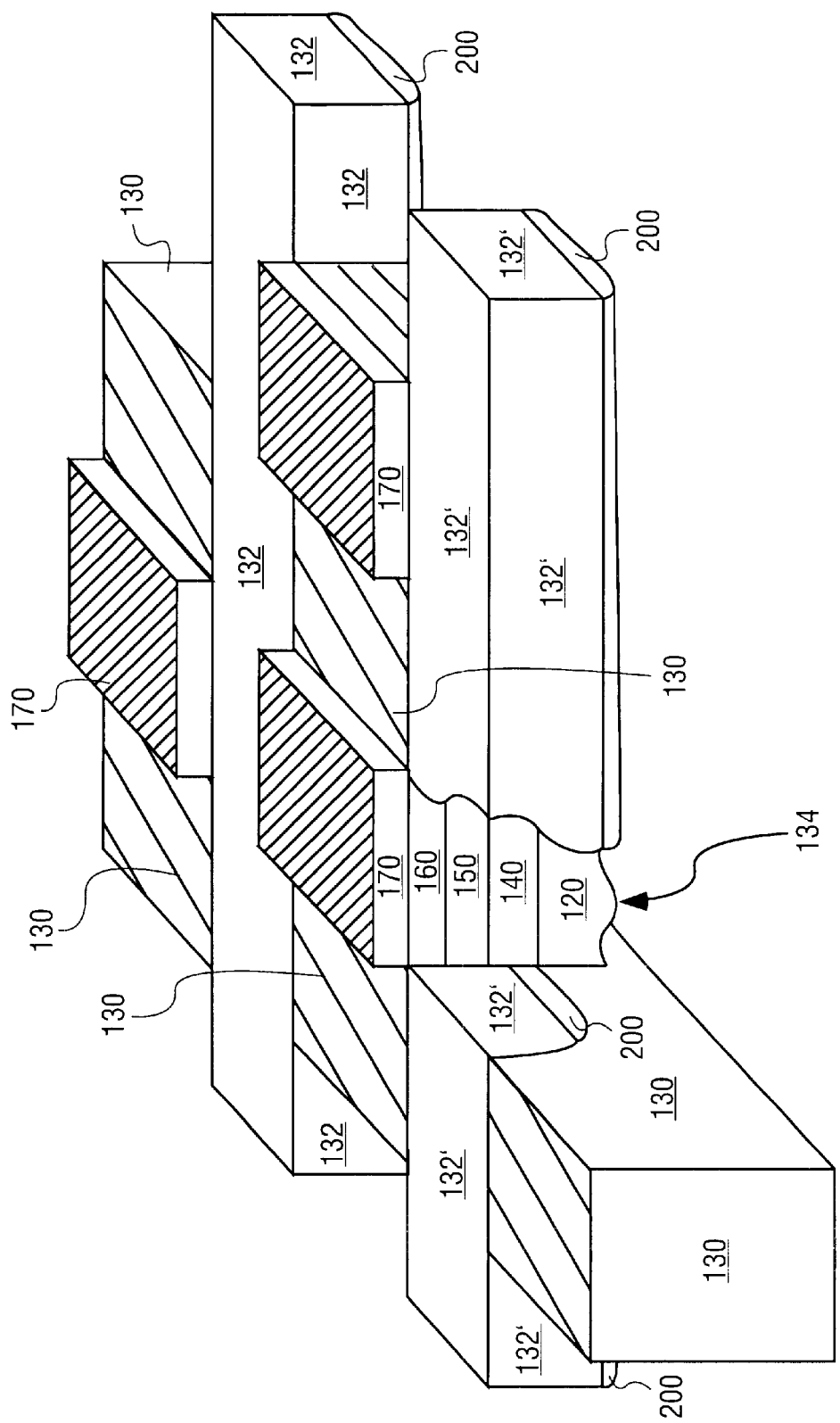
FIG. 13 is another elevational oblique view of selected structures of the inventive memory device after planarization and salicidation.

FIG. 13 is an elevation oblique view of the selected structures depicted in FIG. 12 after formation of a salicide of reducer material 170. Formation of a salicide of reducer material 170 may need to follow planarization of the memory device.

Figure 14:
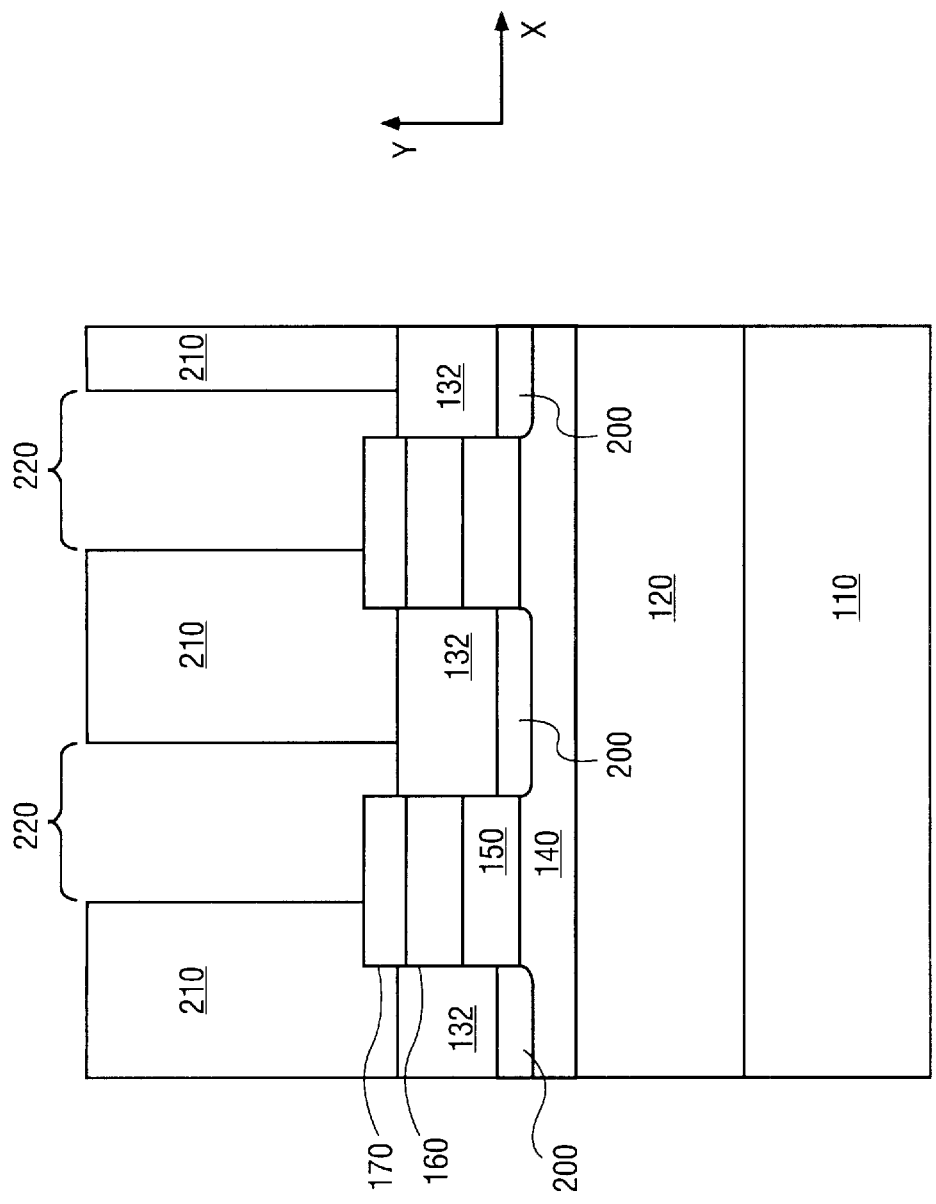
FIG. 14 shows the structure of either FIG. 5 or FIG. 12 after further processing to form a reducer material and a dielectric material with a recess that communicates to the reducer material.

FIG. 14 shows the structure of either FIG. 5 or FIG. 12 after planarization of SST structure 132 and the optional salicidation formation of reducer material 170. The depths of first STI structure 130 and SST structure 132 may vary according to a preferred application. In one embodiment, the depth of first STI structure 130 is in a range from about 3,000 Å to about 7,000 Å The SST structure 132 may have a total depth in a range a range from about 500 Å to about 3,500 Å. In one embodiment, the total depth of first STI structure, beginning at the bottom of reducer material 170 is about 5,300 Å, and the total depth of SST structure 132 is about 2,500 Å.

One aspect of the present invention involves relative depths of the shallow trench isolation structures. The memory cell structure 134 includes a P+ Si structure 160 disposed upon an N Si structure 150. P+ Si structure 160 has a top and a bottom. The N Si structure 150 also has a top and a bottom. As illustrated in FIG. 14, SST structure 132 also has a top and a bottom; and the bottom of SST structure 132 is below P+ Si structure 160, and the top of SST structure 132 is above the bottom of P+ Si structure 160.

Dielectric materials 210 are formed and the formation of trenches 220 through dielectric materials 210 is accomplished to expose reducer material 170. The formation of trenches 220 may be accomplished using etch patterning with an etchant(s) for etching dielectric material 210 and selective to reducer material 170 such that reducer material 170 may serve as an etch stop.

Figure 15:
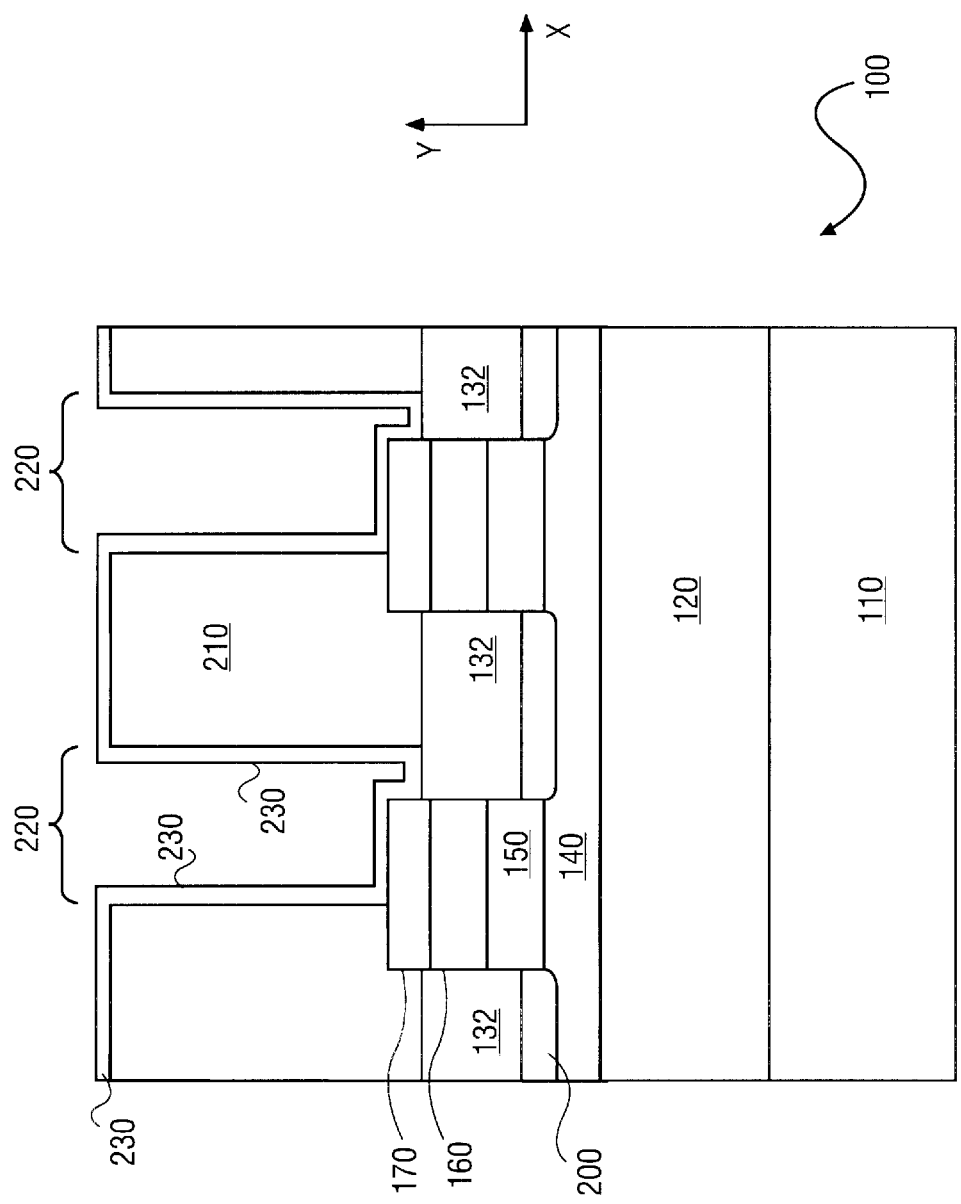
FIG. 15 shows the structure of FIG. 14, through the same cross-sectional view, after the introduction of an electrode material over the structure in accordance with one embodiment of the invention.

FIG. 15 illustrates the inventive process of forming a lower electrode in a phase-change memory device by using the inventive metal compound film. The memory line stack may be referred to as an active area. FIG. 15 shows the structure of FIG. 14 after the conformal introduction of a lower electrode material 230 that may be referred to as a metal compound film, although it may be a conductive or semiconductive polysilicon material or a metal compound material. In one example, metal compound film 230 is a metal nitride compound such as TaN that, depending upon the desired resistivity, may be provided in either stoichiometric or other metal compound film solid solution ratios.

The introduction is conformal in the sense that metal compound film 230 is introduced along the side walls and base of trench 220 such that metal compound film 230 is in contact with reducer material 170. The conformal introduction of metal compound film 230 that is the inventive polysilicon, metal nitride and/or silicide compound may follow conventional introduction techniques known to those skilled in the art including chemical vapor deposition (CVD) techniques.

Trench 220 may be referred to as a recess that is formed in first dielectric 210 to expose at least a portion of the memory cell stack as illustrated in FIG. 15. Although the recess is referred to as trench 220, the type of recess may be selected from a substantially circular recess, a rectangular (square) recess, and a trench recess.

Metal compound film 230 includes a metal and at least one of nitrogen or silicon. A given blend of metal compound may be accomplished by chemical vapor deposition (CVD) of at least one constituent of nitrogen and silicon in connection with the metal. The material of metal compound film 230 is preferably a high resistivity metal compound such as a metal nitride, a refractory metal nitride, a metal silicon nitride, a refractory metal silicon nitride, a metal silicide, and a refractory metal silicide. Preferably, the composition of metal compound film 230 is controlled by feed stream amounts to a CVD tool. Depending upon the specific embodiment, other CVD techniques may be used such as plasma enhanced CVD (PECVD).

In another embodiment, the formation of metal compound film 230 is carried about by physical vapor deposition (PVD) and a target is selected that has a preferred composition for the final metal compound film. Alternatively, a plurality of targets may be combined to achieve a preferred metal compound film composition. In either PVD or CVD, coverage as defined as the ratio of wall deposited thickness to top-deposited thickness, is in a range from about 0.25 to about 1, and preferably about 0.5. In the present invention, CVD formation of lower electrode is preferred.

Where a metal nitride is selected for metal compound film 230, the metal may be selected from Ti and Zr and the like. It may also be selected from Ta and Nb and the like. It may also be selected from W and Mo and the like. It may also be selected from Ni and Co and the like. The metal nitride is preferably a refractory metal nitride compound of the formula $M_xN_y$. The ratio of M:N is in a range from about 0.5:1 to about 5:1, preferably from about 0.6:1 to about 2:1, and most preferably about 1:1. For example, one embodiment of the present invention is a $Ta_xN_y$ compound in the ratio from about 0.5:1 to about 5:1, preferably from about 0.6:1 to about 2:1, and most preferably about 1:1. Another example of an embodiment is a $W_xN_y$ compound in the ratio from about 0.5:1 to about 5:1, preferably from about 0.6:1 to about 2:1, and most preferably about 1:1.

In another embodiment of the invention, metal compound film 230 may be a metal silicon nitride compound. The metals may be selected from the metal may be selected from Ti and Zr and the like. It may also be selected from Ta and Nb and the like. It may also be selected from W and Mo and the like. It may also be selected from Ni and Co and the like. The metal silicon nitride compound may have the formula $M_xSi_zN_y$, and wherein the ratio of M:Si:N is in a range from about 1:0.5:0.5 to about 5:1:1. Preferably, the ratio is in a range from about 1:1:0.5 to 1:0.5:1, and most preferably about 1:1:1. In one embodiment, a lower electrode material compound is $Ti_xSi_yN_z$ in a ratio from about 1:0.5:0.5 to about 5:1:1, preferably from about 1:1:0.5 to 1:0.5:1, and most preferably about 1:1:1.

In another embodiment, the lower electrode may be a metal silicide compound. The metals may be selected from the metal may be selected from Ti and Zr and the like. It may also be selected from Ta and Nb and the like. It may also be selected from W and Mo and the like. It may also be selected from Ni and Co and the like. The metal silicide compound may have the formula $M_xSi_z$, wherein the ratio of M:Si: is in a range from about 0.5:1 to about 5:1. In one embodiment, a lower electrode material compound is $Ti_xSi_y$ in a ratio from about 0.5:1 to about 5:1, preferably from about 0.6:1 to about 2:1, and most preferably about 1:1. In another embodiment, a lower electrode material compound is $W_xSi_y$ in a ratio from about 0.5:1 to about 5:1, preferably from about 0.6:1 to about 2:1, and most preferably about 1:1.

Figure 16:
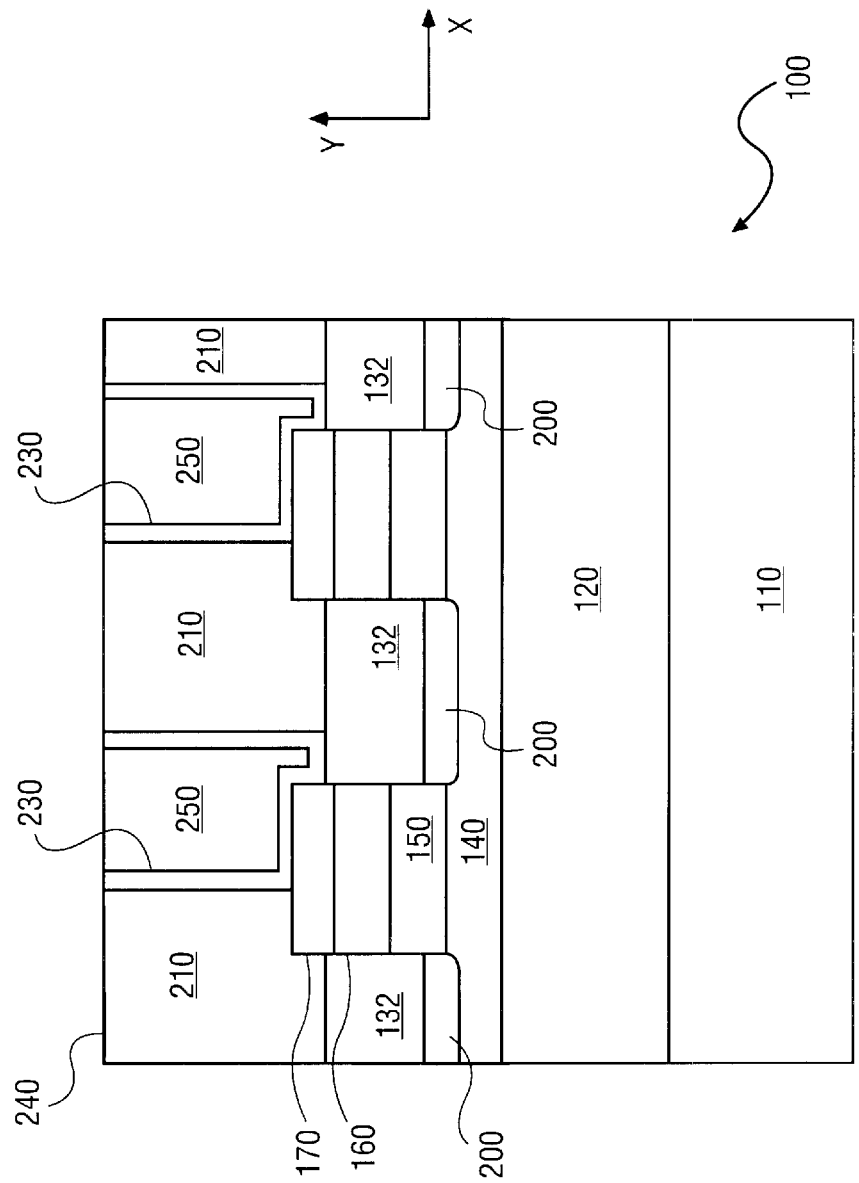
FIG. 16 shows the structure of FIG. 15, through the same cross-sectional view, after fill of the recess and after planarization.

FIG. 16 illustrates further process of the structure depicted in FIG. 15. Following the formation of metal compound film 230, recess 220 is filled with a second dielectric 250. Second dielectric 250 may be formed by chemical vapor deposition of a silicon-containing substance selected from silicon oxide such a tetra ethyl ortho silicate (TEOS) process and the like.

Following the formation of second dielectric 250, all material that resides above what will become the top level 240 of recess is removed as illustrated in FIG. 16. Removal of material may be accomplished by processes such as chemical mechanical planarization (CMP), mechanical planarization, and the like. Removal of material may be accomplished by processes such as isotropic etchback, anisotropic etchback, and the like.

Figure 17:
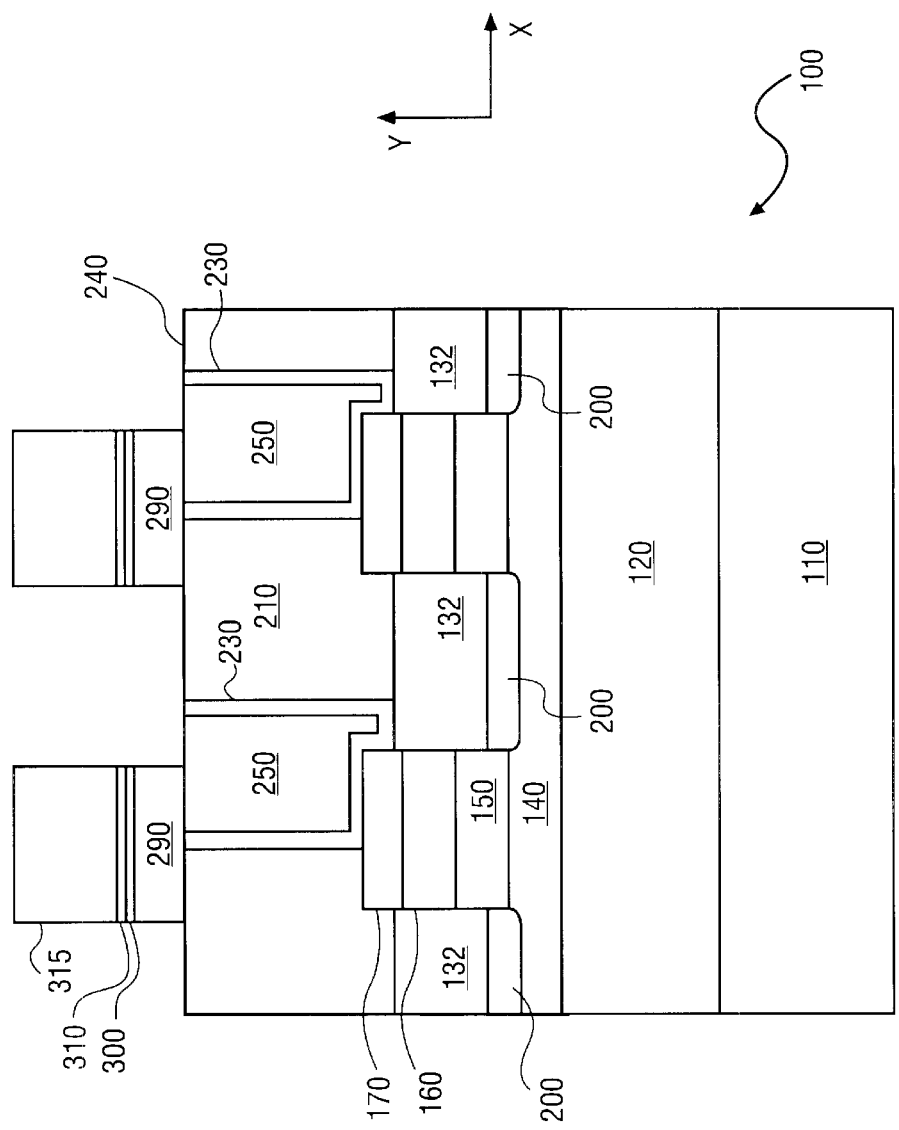
FIG. 17 shows the structure of FIG. 16, through the same cross-sectional view, after the introduction of a volume of memory material and a second conductor over the structure, in accordance with one embodiment of the invention.

FIG. 17 shows the structure of FIG. 16 after the introduction of a volume of memory material 290 (represented as memory element 30 in FIG. 1). In one example, memory material 290 is a phase change material. In a more specific example, memory material 290 includes a chalcogenide element(s). Examples of phase change memory material 290 include, but are not limited to, compositions of the class of tellerium-germanium-antimony ($Te_xGe_ySb_z$) material in both stoichiometric and solid-solution ratios. The volume of memory material 290, in one example according to current technology, is introduced and patterned with a thickness in a range from about 300 Å to about 6,000 Å.

Overlying the volume of memory material 290 in the structure of FIG. 17 are barrier materials 300 and 310 of, for example, Titanium (Ti) and Titanium Nitride (TiN), respectively. The barrier materials serve, in one aspect, to inhibit diffusion between the volume of memory material 290 and second conductor or signal line material overlying the volume of memory material 290 (e.g., second electrode 10). Overlying barrier materials 300 and 310 is second conductor or signal line material 315. In this example, second conductor or signal line material 315 serves as an address line, a column line (e.g., column line 10 of FIG. 1). Second conductor or signal line material 315 is patterned to be, in one embodiment, generally orthogonal to first conductor or signal line material 140 (column lines are orthogonal to row lines). Second conductor or signal line material 315 is, for example, an aluminum material, such as an aluminum alloy. Methods for the introduction and patterning of the barrier materials and second conductor or signal line material 315 include such techniques as known to those of skill in the art.

Figure 18:
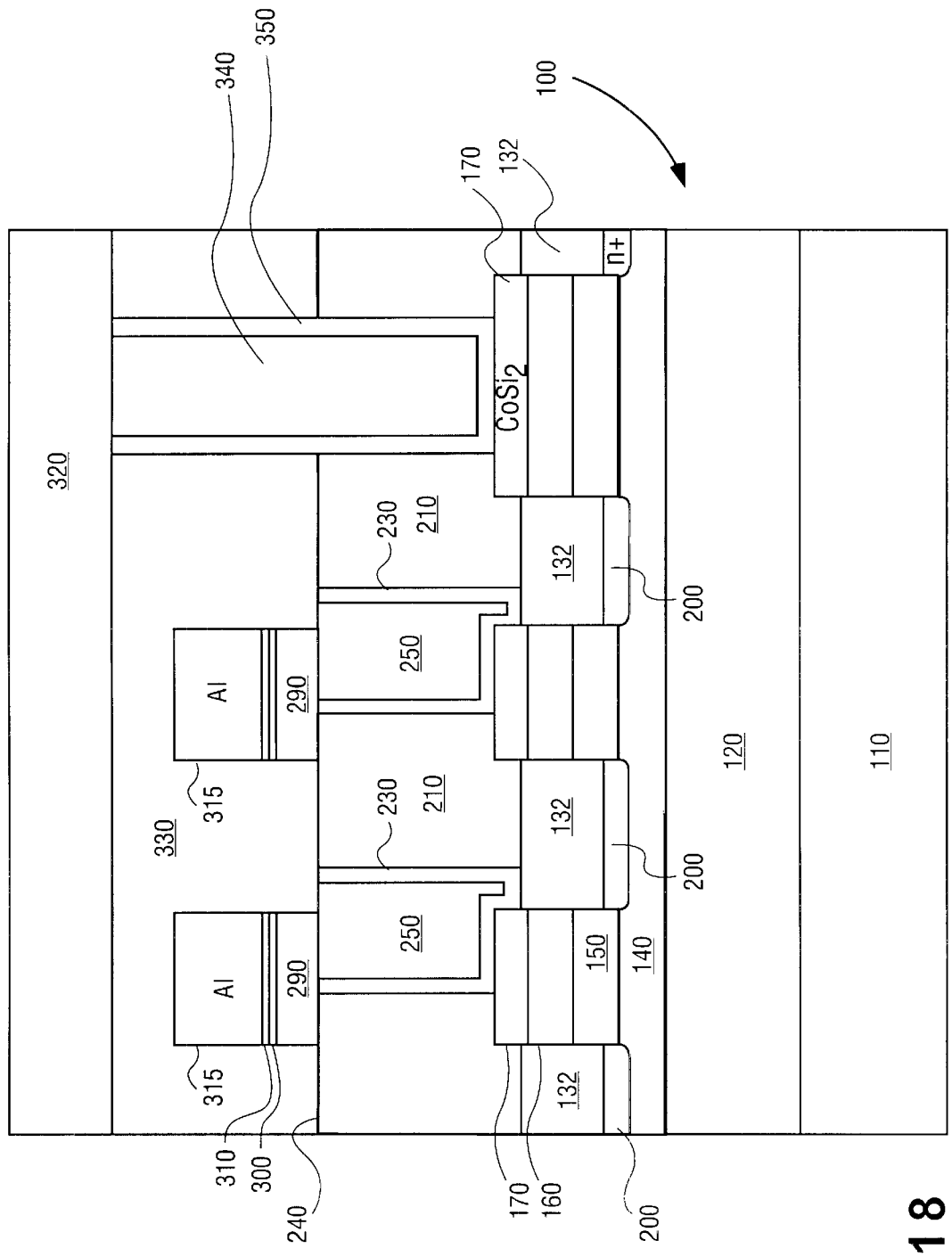
FIG. 18 shows the structure of FIG. 17, through the same cross-sectional view, after the introduction of the dielectric material over the second conductor and a third conductor coupled to the first conductor in accordance with an embodiment of the invention.

FIG. 18 shows the structure of FIG. 17 after the introduction of dielectric material 330 over second conductor or signal line material 315. Dielectric material 330 is, for example, $SiO_2$ or other suitable material that surrounds second conductor or signal line material 315 and memory material 290 to electronically isolate such structure. Following introduction, dielectric material 330 is planarized and a via such as a contact corridor is formed in a portion of the structure through dielectric material 330, dielectric material 210, and masking material 180 to reducer material 170. The via is filled with conductive material 340 such as tungsten (W) and barrier material 350 such as a combination of titanium (Ti) and titanium nitride (TiN). Techniques for introducing dielectric material 330, forming and filling conductive vias, and planarizing are known to those skilled in the art.

The structure shown in FIG. 18 also shows additional conductor or signal line material 320 introduced and patterned to mirror that of first conductor or signal line material 140 (e.g., row line) formed on substrate 100. Mirror conductor line material 320 mirrors first conductor or signal line material 140 and is coupled to first conductor or signal line material 140 through a conductive via. By mirroring a doped semiconductor such as N-type silicon, mirror conductor line material 320 serves, in one aspect, to reduce the resistance of conductor or signal line material 140 in a memory array, such as memory array 5 illustrated in FIG. 1. A suitable material for mirror conductor line material 320 includes an aluminum material, such as aluminum or an aluminum alloy.

In the above description of forming a memory element such as memory element 15 in FIG. 1, metal compound film 230 is an electrode and is described between a memory material and conductors or signal lines (e.g., row lines and column lines) that has improved electrical characteristics. In the embodiment described, the resistivity of the electrode is selected to make a given metal compound film 230 as set forth herein. In this manner, a supplied voltage from second conductor or signal line material 320 or first conductor or signal line material 140 to the memory material 290 may be near the volume of memory material 290 and dissipation of energy to cause a phase change may be minimized. The discussion detailed the formation of one memory element of memory array 5. Other memory elements of memory array 5 may be fabricated in the same manner. It is to be appreciated that many, and possibly all, memory elements of memory array 5, along with other integrated circuit circuitry, may be fabricated simultaneously.

Figure 19:
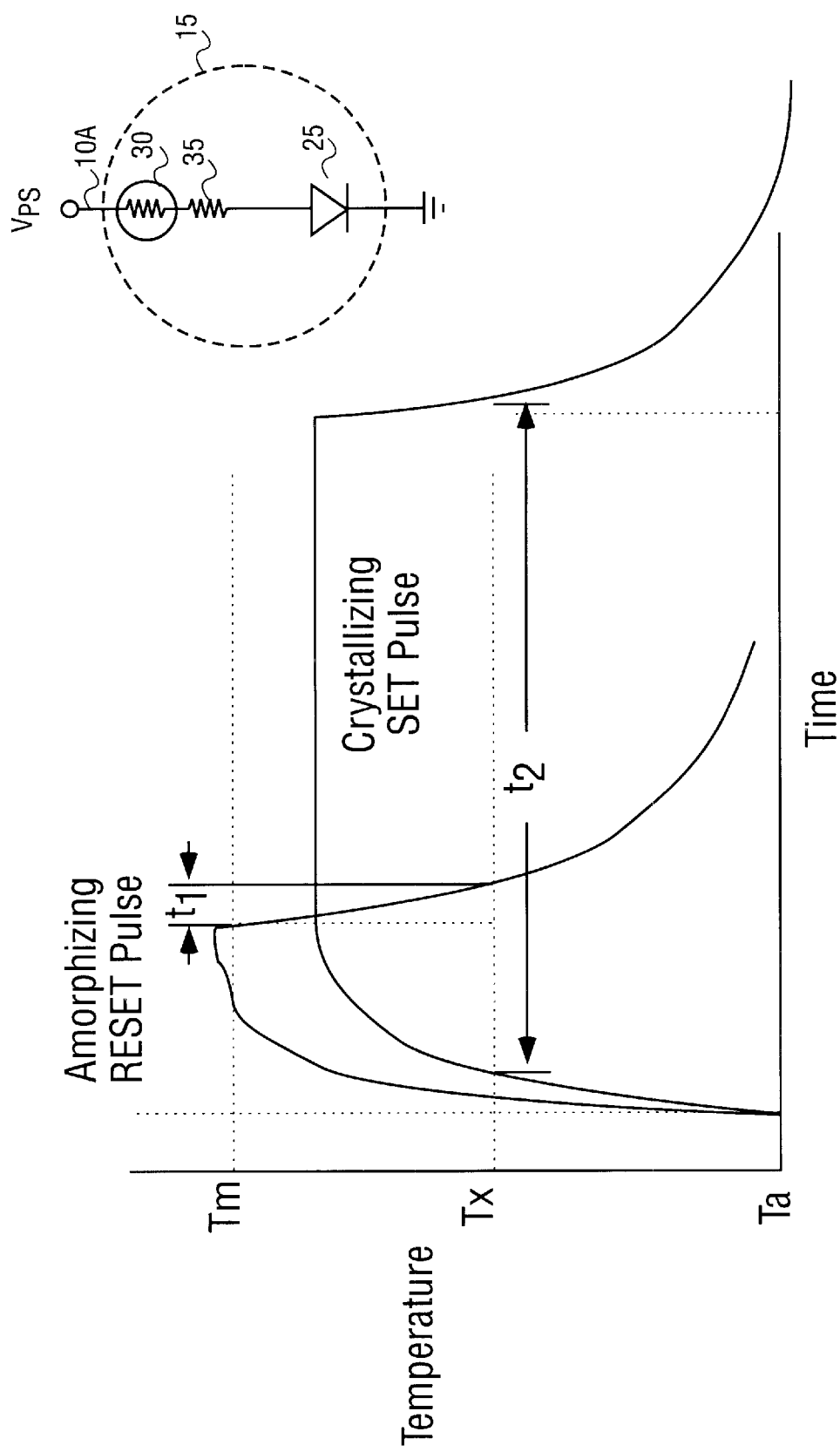
FIG. 19 shows a graphical representation of setting and resetting a volume of a phase change memory material in terms of temperature and time.

FIG. 19 presents a graphical representation of the setting and resetting of a volume of phase change memory material. Referring to FIG. 1, setting and resetting memory element 15 (addressed by column line 10a and row line 20a) involves, in one example, supplying a voltage to column line 10a to introduce a current into the volume of memory material 30 as illustrated in FIG. 1 or memory material 290 as illustrated in FIG. 12. The current causes a temperature increase at the volume of memory material 30. Referring to FIG. 19, to amorphize a volume of memory material, the volume of memory material is heated to a temperature beyond the amorphisizing temperature, $T_M$. Once a temperature beyond $T_M$ is reached, the volume of memory material is quenched or cooled rapidly (by removing the current flow). The quenching is accomplished at a rate, $t_1$, that is faster than the rate at which the volume of memory material 30 can crystallize so that the volume of memory material 30 retains its amorphous state. To crystallize a volume of memory material 30, the temperature is raised by current flow to the crystallization temperature for the material and retained at that temperature for a sufficient time to crystallize the material. After such time, the volume of memory material is quenched (by removing the current flow).

In each of these examples of resetting and setting a volume of memory material 30, the importance of concentrating the temperature delivery at the volume of memory material 30 is illustrated. One way this is accomplished is modifying a portion of the electrode as described above. The inset of FIG. 19 shows memory cell 15 having an electrode with modified portion 35 (illustrated as a resistor) to concentrate heat (current) at the volume of memory material 30.

In the preceding example, the volume of memory material 30 was heated to a high temperature to amorphisize the material and reset the memory element (e.g., program 0). Heating the volume of memory material to a lower crystallization temperature crystallizes the material and sets the memory element (e.g., program 1). It is to be appreciated that the association of reset and set with amorphous and crystalline material, respectively, is a convention and that at least an opposite convention may be adopted. It is also to be appreciated from this example that the volume of memory material 30 need not be partially set or reset by varying the current flow and duration through the volume of memory material.

Another advantage exists where a metal compound electrode is used. Because a metal-to-metal interface exists between the lower electrode and the volume of memory material, a lower interface resistance may exist that that of a doped polysilicon-chalcogenide interface.

Because of the chemical makeup of the inventive metal compound film 230 that forms the lower electrode, process flow is simplified. For example, implanting polysilicon and activating it is not required in the process flow. A doped polysilicon lower electrode requires processing such as a doping process, an anneal process to activate the doped electrode to make it conductive, a barrier layer between the lower electrode upper surface, and processing to compositionally modify the upper surface for an enhanced heating at the upper surface.

In contrast, the inventive lower electrode is formed of metal compound film 230 and dielectric material is filled next to it. Thereafter, CMP is carried out and the memory material 290 material may be deposited.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A memory device comprising:
   a memory cell structure;
   a first isolation trench that is contiguous to the memory cell structure; and
   a second isolation trench that is contiguous to the memory cell structure and orthogonal to the first isolation trench structure,
   wherein a first edge of the memory cell structure defines a first feature of a unit cell,
   wherein a second edge of the memory cell structure defines a second feature of the unit cell,
   wherein an edge of the first isolation trench defines a third feature of the unit cell,
   wherein an edge of the second isolation trench defines a fourth feature of the unit cell.

2. The memory device according to claim 1, wherein the a memory cell structure first isolation trench and second isolation trench define a four feature size squared ($4F^2$).

3. The memory device according to claim 1 wherein the memory device is disposed in a substrate, and wherein the first isolation trench is disposed deeper in the substrate than the second isolation trench.

4. The memory device according to claim 1 wherein the memory device is disposed in a substrate, and wherein the first isolation trench comprises a discontinuous upper surface and the second isolation trench comprises a substantially continuous upper surface.

5. The memory device according to claim 1, wherein the memory cell structure is spaced apart and isolated by a single feature (1F).

6. The memory device according to claim 1, wherein the first isolation trench comprises a single shallow trench isolation structure.

7. The memory device according to claim 1, wherein the memory cell structure comprises:

a P+ Si structure disposed upon an N Si structure, wherein the P+ Si structure has a top and a bottom, wherein the N Si structure has a top and a bottom; and wherein the second isolation trench has a top and a bottom; and wherein the second isolation trench bottom is below the P+ Si structure.

8. The memory device according to claim 1, wherein the memory cell structure comprises:

a P+ Si structure disposed upon an N Si structure, wherein the P+Si structure has a top and a bottom, wherein the N Si structure has a top and a bottom; and wherein the second isolation trench has a top and a bottom, wherein the second isolation trench bottom is below the P+ Si structure, and wherein the second isolation trench top is above the P+ Si structure bottom.

9. The memory device according to claim 1, wherein the memory cell structure comprises:

a diode stack structure comprising:

an N+ Si row select;

an N Si disposed on the N+ Si row select;

a P+ Si layer disposed on the N Si layer; and a silicide layer.

10. A phase-change memory device comprising:

a first trench disposed in the substrate;

a second trench disposed in the substrate, wherein the second trench is orthogonal to the first trench;

a diode stack that is disposed contiguous to the first trench and the second trench;

a first dielectric disposed over the diode stack;

a recess disposed in the first dielectric that exposes the diode stack;

a lower electrode disposed in the recess of a first dielectric;

a volume of phase-change material disposed over the lower electrode; and at least one address line coupled to the phase-change material.

11. The phase-change memory device according to claim 10, further comprising:

an intermittent upper surface shallow trench isolation structure disposed in the second trench; and a substantially continuous upper surface shallow trench isolation structure disposed in the first trench.

12. The phase-change memory device according to claim 11, wherein the lower electrode comprises:

a metal compound layer conformally disposed in the recess and over the diode stack, wherein the metal compound is selected from polysilicon, a metal nitride, a refractory metal nitride, a metal silicon nitride, a refractory metal silicon nitride, a metal silicide, and a refractory metal silicide.

13. An apparatus comprising:

a dedicated memory chip having a memory array including a first trench disposed in a substrate, a second trench disposed in the substrate, wherein the second trench is orthogonal to the first trench, a diode stack that is disposed contiguous to the first trench and the second trench, a first dielectric disposed over the diode stack, a recess disposed in the first dielectric that exposes the diode stack, a lower electrode disposed in the recess of a first dielectric, a volume of phase-change memory material disposed above the lower electrode, and addressing circuitry coupled to the memory array.

14. The apparatus according to claim 13, wherein the memory array further includes an intermittent upper surface shallow trench isolation structure disposed in the second trench, and a substantially continuous upper surface shallow trench isolation structure disposed in the first trench.

15. The apparatus according to claim 14, wherein the lower electrode includes a metal compound layer conformably disposed in the recess and over the diode stack, wherein the metal compound is selected from polysilicon, a metal nitride, a refractory metal nitride, a metal silicon nitride, a refractory metal silicon nitride, a metal silicide, and a refractory metal silicide.

* * * * *

UNITED STATES PATENT AND TRADEMARK OFFICE
CERTIFICATE OF CORRECTION

PATENT NO. : 6,437,383 B1
DATED : August 20, 2002
INVENTOR(S) : Xu

It is certified that error appears in the above-identified patent and that said Letters Patent is hereby corrected as shown below:

Column 6,
Line 31, delete "$Si_xO_2$", insert -- $Si_x O_z$ --.

Signed and Sealed this

Fourth Day of February, 2003

JAMES E. ROGAN
*Director of the United States Patent and Trademark Office*